United States Patent
Passerini et al.

(10) Patent No.: US 8,493,137 B2
(45) Date of Patent: Jul. 23, 2013

(54) PSRR IN A VOLTAGE REFERENCE CIRCUIT

(75) Inventors: Marco Passerini, Lozza (IT); Francesco Mannino, Genoa (IT); Chiara Missiroli, Concorezzo (IT)

(73) Assignee: Elpida Memory, Inc., Tokyo (JP)

( * ) Notice: Subject to any disclaimer, the term of this patent is extended or adjusted under 35 U.S.C. 154(b) by 11 days.

(21) Appl. No.: 13/234,766

(22) Filed: Sep. 16, 2011

(65) Prior Publication Data

US 2013/0069715 A1   Mar. 21, 2013

(51) Int. Cl.
  *G05F 1/575* (2006.01)
  *H02M 3/16* (2006.01)

(52) U.S. Cl.
  USPC .......................... 327/541; 327/543; 323/266

(58) Field of Classification Search
  None
  See application file for complete search history.

(56) References Cited

U.S. PATENT DOCUMENTS

| | | | | |
|---|---|---|---|---|
| 5,703,588 A * | 12/1997 | Rivoir et al. | | 341/159 |
| 6,624,662 B1 * | 9/2003 | Volk | | 326/87 |
| 6,949,971 B2 * | 9/2005 | Jang | | 327/541 |
| 7,019,585 B1 * | 3/2006 | Wilson et al. | | 327/541 |
| 7,113,881 B2 * | 9/2006 | Boerstler et al. | | 702/117 |
| 7,233,274 B1 * | 6/2007 | Kuhn | | 341/161 |
| 7,589,584 B1 * | 9/2009 | Bui | | 327/538 |
| 8,054,057 B2 * | 11/2011 | Dash et al. | | 323/282 |
| 2006/0103451 A1 * | 5/2006 | Lim et al. | | 327/540 |

* cited by examiner

*Primary Examiner* — Lincoln Donovan
*Assistant Examiner* — Terry L Englund
(74) *Attorney, Agent, or Firm* — Morrison & Foerster LLP (57) ABSTRACT

Devices and circuits for voltage reference architectures that can increase the PSRR parameter by improving the saturation margin for an output transistor. For example, a device can include a current source coupled between a first power supply line and a circuit node, a voltage production circuit coupled between the circuit node and a second power supply line to produce a plurality of voltages respectively at voltage nodes thereof, a multiplexer coupled to the voltage nodes of the voltage production circuit and the output node and configured to select and output one of the voltages to the output node, and a control circuit configured to supply the one of the voltages to the circuit node.

20 Claims, 14 Drawing Sheets

Fig. 1a

Prior Art

Fig. 1b

Prior Art

|  | a1 b1: ON others: OFF | a2 b2: ON others: OFF | a3 b3: ON others: OFF | a4 b4: ON others: OFF |
|---|---|---|---|---|
| V1 | 1.3 | 1.25 | 1.2 | 1.15 |
| V2 | 1.25 | 1.25 | 1.2 | 1.15 |
| V3 | 1.2 | 1.2 | 1.2 | 1.15 |
| V4 | 1.15 | 1.15 | 1.15 | 1.15 |
| Vout | 1.3 | 1.25 | 1.2 | 1.15 |
| MOS transistor M | Triode | Saturation | Saturation | Saturation |

PSRR IN A VOLTAGE REFERENCE CIRCUIT

FIELD OF THE DISCLOSURE

This disclosure generally relates to techniques and circuits for a flash memory as a non-volatile memory device, and more particularly to a voltage reference circuit for a flash memory.

BACKGROUND

Figure 1A:
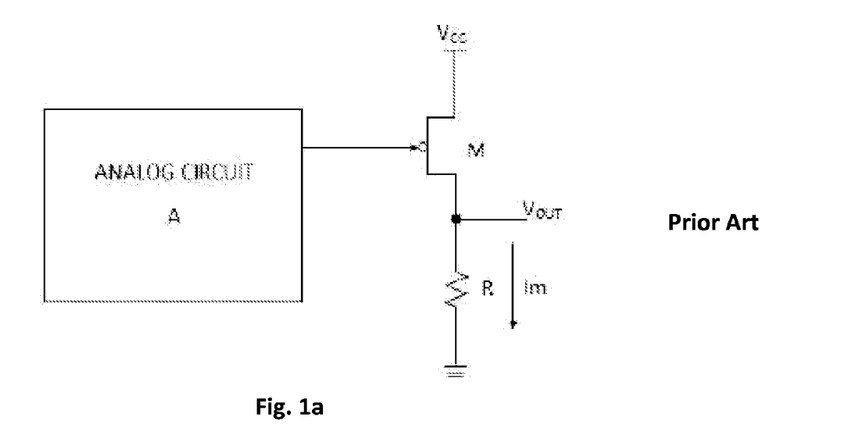
FIG. 1(a) illustrates an exemplary circuit architecture of a voltage reference with a resistor in the output stage.
Figure 1B:
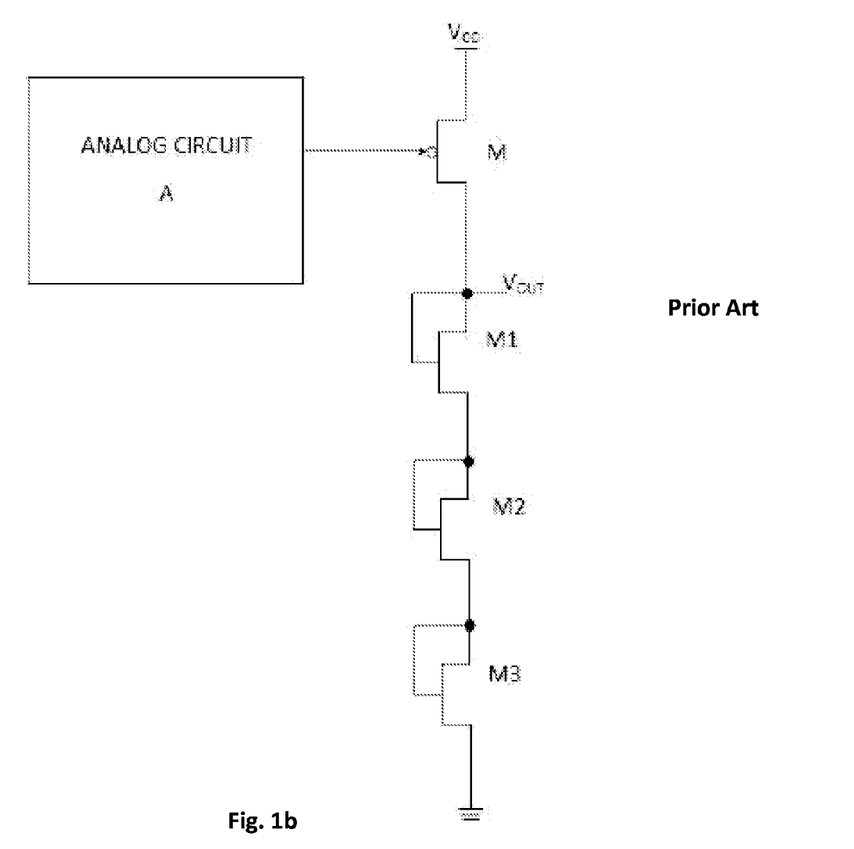
FIG. 1(b) illustrates an exemplary circuit architecture of a voltage reference with diode-connected NMOS transistors in the output stage

A voltage reference is a circuit that outputs a DC voltage signal. It can be employed on systems, sub-systems, and/or devices that need a voltage reference level for various purposes, such as to precisely generate DC voltages or digital clock signals. Voltage reference circuits are used in many electronic fields in many technologies, such as in NAND flash memory. FIGS. 1a and 1b depict block diagrams illustrating generic architectures of exemplary voltage reference circuits.

FIG. 1a depicts an analog circuit A having an output connected to a gate of a PMOS transistor M. The source and bulk terminals of the transistor M both connect to $V_{cc}$, which is the power supply of the system. The drain terminal of the transistor M connects to a resistor R. The output of the circuit, $V_{out}$, is given by $V_{out}=R*I_m$, where $I_m$ is the current flowing through the transistor M. In this case, the load is the resistor R.

FIG. 1b depicts an analog circuit A having an output connected to a gate of a PMOS transistor M. As with FIG. 1a, the source and bulk terminals of the transistor M both connect to $V_{cc}$. The drain terminal of the transistor M connects to a cascade of MOS transistors M1, M2, and M3 in a diode configuration. The transistors in the cascade are depicted as NMOS transistors, though PMOS transistors may be used as well. In this case, the load is the chain of NMOS transistors.

The output of these circuits, $V_{out}$, can be used in various applications. For example, $V_{out}$ can be used in a voltage regulator as a reference to generate higher or lower voltage levels, in an oscillator to generate digital clock signals with a precise period value, or in a comparator to define the comparator voltage threshold.

In some applications, it is necessary for the reference voltage $V_{out}$ to be insensitive to temperature and power supply variations. For example, the above architectures can be applied in the case of a band-gap voltage generator, as illustrated in FIG. 2, and in the case of a current mirror, as illustrated in FIGS. 3 and 4.

Figure 2:
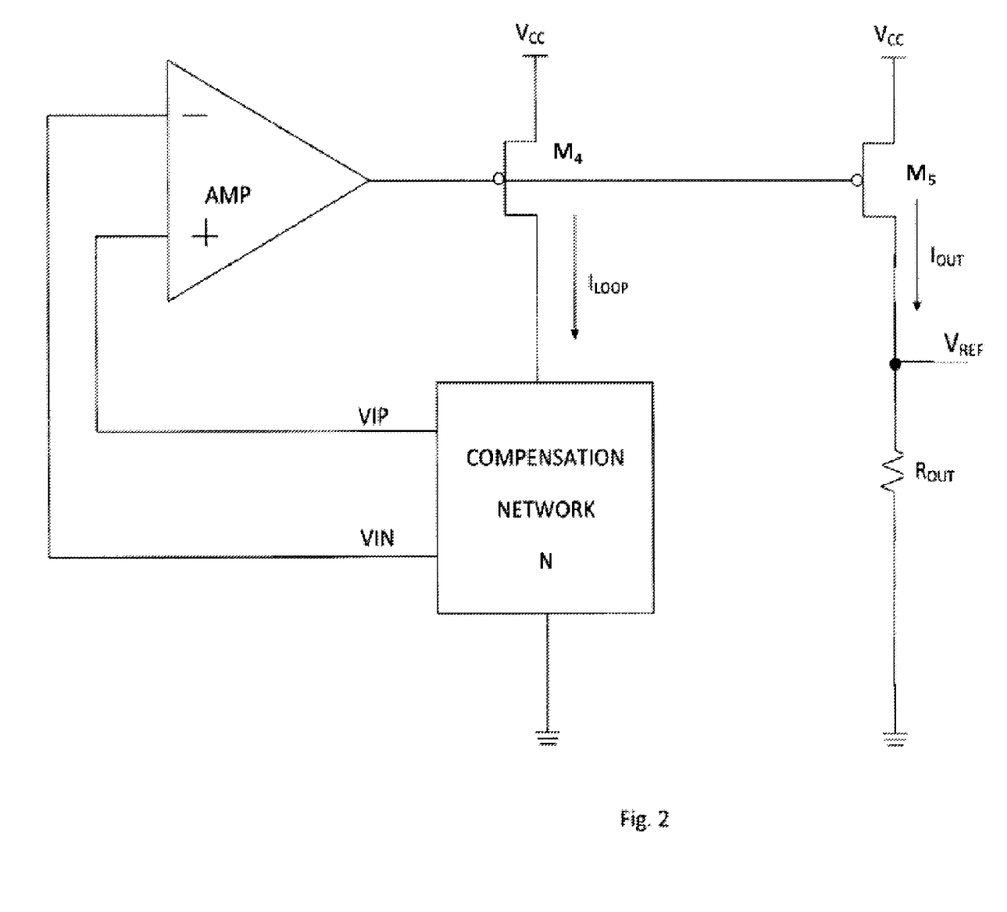
FIG. 2 illustrates an exemplary circuit architecture of a band-gap voltage reference.

FIG. 2 depicts a general schematic of an exemplary band-gap voltage generator. Compensation network N can be composed of bipolar junction transistors and resistors so that output node $V_{REF}$ is compensated over temperature. VIP connects to a positive input of an operational amplifier AMP while VIN connects to a negative input of AMP. The output node of AMP connects to the gate terminal of the M4 and M5 PMOS transistors. AMP can equalize the VIP and VIN nodes and stabilize the amplifier's operation using negative feedback. The source and bulk terminals of the M4 and M5 transistors connect to $V_{cc}$. The drain terminal of the M4 transistor connects to compensation network N and the drain terminal of the M5 transistor connects to the resistor $R_{OUT}$. According to this configuration, the band-gap voltage generator can output a reference voltage $V_{REF}$ that is insensitive to both temperature and power supply variations.

Figure 3:
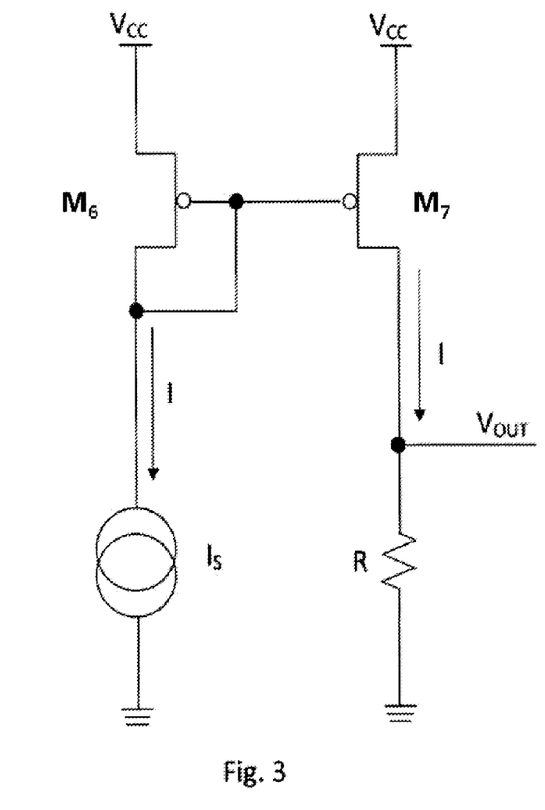
FIG. 3 illustrates an exemplary circuit architecture of a PMOS current mirror.
Figure 4:
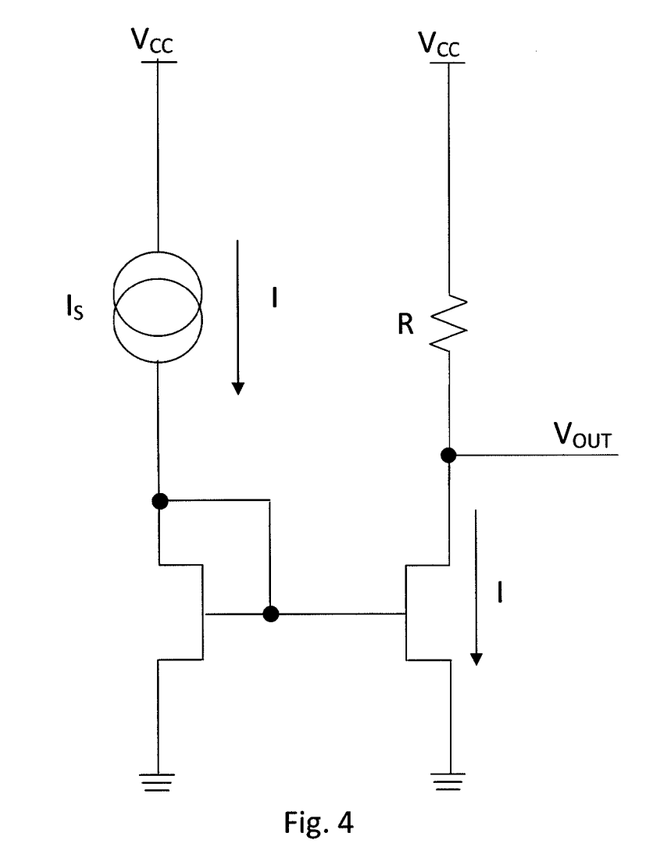
FIG. 4 illustrates an exemplary circuit architecture of an NMOS current mirror.

FIG. 3 depicts a current mirror with a PMOS structure. A current mirror is a circuit configured to copy (i.e., mirror) a current passing through one active device by controlling the current in another active device while keeping the output current constant regardless of loading. In FIG. 3, $I_S$ is an ideal current source that generates a current I. The current I is mirrored by the M6 and M7 PMOS transistors. The output of the circuit $V_{OUT}$ is given by $V_{OUT}=R*I$. As still another example, FIG. 4 depicts a variation of a current mirror in which the output voltage $V_{OUT}$ is referred to $V_{cc}$ instead of ground.

In many of these applications, it is necessary to correct the value of the output voltage over the possible spreads and variations that may result from various factors. Some exemplary factors are resistivity variations for resistors, threshold voltage and trans-conductance variations for MOS transistors, and the like. An exemplary trimming technique and circuit therefor to correct the output voltage value is illustrated in FIG. 5.

Figure 5:
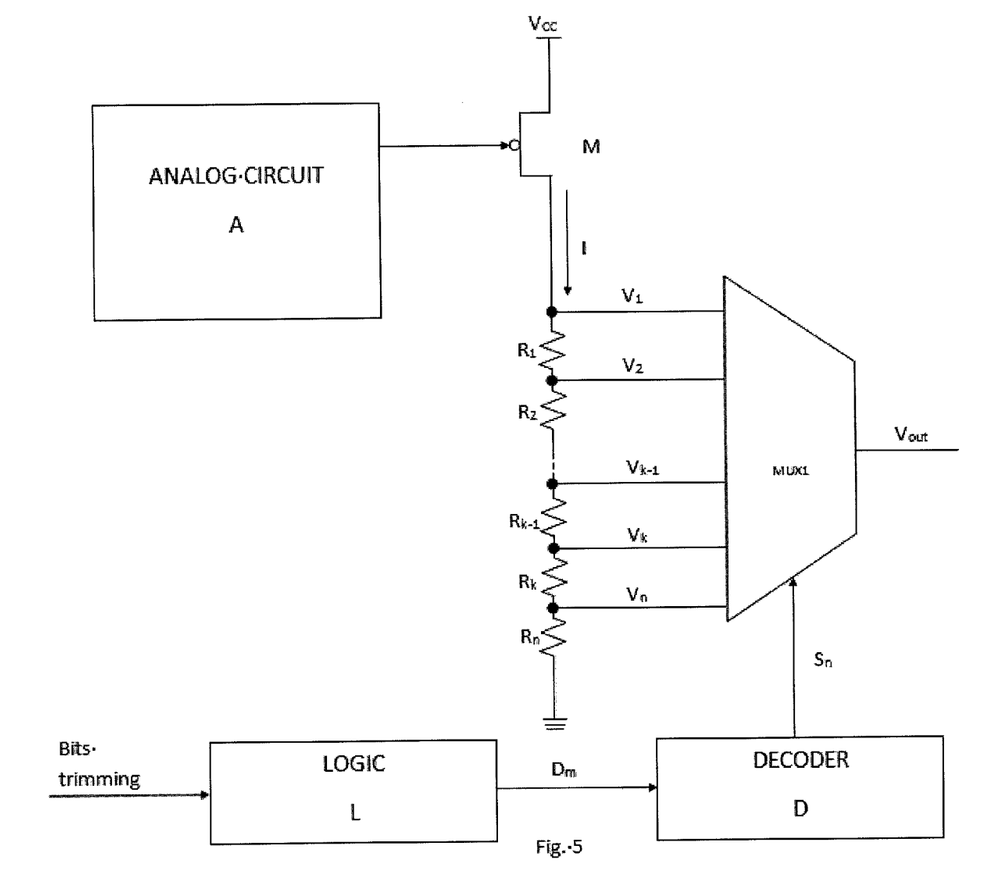
FIG. 5 illustrates an exemplary circuit architecture of a voltage reference with a multiplexer, a decoder, and a logic block for trimming purposes.

FIG. 5 shows an analog circuit A having an output connected to a gate of a PMOS transistor M. The source and bulk terminals of the M transistor both connect to $V_{cc}$, where $V_{cc}$ is the power supply of the system. The drain terminal of the M transistor connects to a resistor $R_1$. Resistor $R_1$ connects to ground through a chain of resistors—$R_2$, $R_3$, ..., $R_{k-1}$, $R_k$, ..., $R_n$. This creates a resistive partition from which multiple voltage levels may be extracted—$V_1$, $V_2$, $V_3$, $V_{k-1}$, $V_k$, ..., $V_n$. The voltages can be selectively extracted using a multiplexer, such as MUX1 shown in FIG. 5. The voltages that can be extracted can be represented as follows:

$$V_1=(R_1+R_2+R_3+\ldots+R_{k-1}R_k+\ldots+R_n)*I,$$

$$V_2=(R_2+R_3+\ldots+R_{k-1}+R_k+\ldots+R_n)*I,$$

$$V_3=(R_3+\ldots R_{k-1}+R_k+\ldots+R_n)*I,$$

$$V_{k-1}=(R_{k-1}+R_k+\ldots+R_n)*I,$$

$$V_k=(R_k+\ldots+R_n)*I,$$

where I is the current flowing through transistor M.

Voltage extraction can be performed as follows. The various voltages can be connected to the inputs of multiplexer MUX1. MUX1 can be an analog circuit that delivers one voltage level among those connected to its inputs based on the value of logic signals of bus $S_n$. The selected voltage is then output as $V_{out}$. Bus $S_n$ can include selection signals $S_1$, $S_2$, $S_3$, ..., $S_{k-1}$, $S_k$, ..., $S_n$, for example. These logic signals can be generated by a decoder D, which can be a logic circuit that converts coded inputs into coded outputs. Decoder D can receive at its input a signal $D_m$ from a logic circuit L and decode it into the appropriate selection signal $S_1$ through $S_n$. The inputs to logic circuit L can be trimming signals, which can also be called configuration signals. The trimming signals may be generated from fuses or memory cells/blocks dedicated for this purpose, for example.

To determine the appropriate voltage to select, the various selectable voltage levels can be measured to determine which one is closest to a target value. The target value can be a voltage level that is desired, to serve as a voltage reference signal, for example. The voltage closest to the target value can then be selected and output as $V_{out}$ by enabling the appropriate configuration signal.

A drawback of this technique and architecture is that PMOS output transistor M might operate with a low saturation margin, especially under low power supply conditions. For example, with reference to FIG. 5, assume that the optimum value to be output by multiplexer MUX1 as $V_{out}$ $V_3$, because $V_3$ is the closest voltage to the target value. $V_1$, which is the drain voltage of PMOS output transistor M, will be higher than $V_3$. This is because $V_1$ is equal to $V_3+V_{drop}$, where $V_{drop}$ is equal to the amount that the drain voltage drops from transistor M to node $V_3$. $V_{drop}$ can be given by $V_{drop}=I*R_{drop}$, where I is the current flowing through transistor M and $R_{drop}$ is the sum of the value of the resistors from node $V_1$ to node $V_3$ (i.e., $R_{drop}=R_1+R_2$). This value could limit the saturation margin of transistor M. As a result, output voltage $V_{out}$ might become imprecise and sensitive to power supply variations.

The above described problem could compromise the power supply rejection ratio (PSRR). The PSRR is a term used in voltage reference and voltage regulator architectures to describe the amount of noise from a power supply that a particular device can tolerate. Essentially, a given device is capable of rejecting the noise up to its PSRR. The PSRR can be defined as the ratio of the output voltage variation to the change of supply voltage of the device.

SUMMARY

According to an embodiment, there is provided a device that includes a current source coupled between a first power supply line and a circuit node, a voltage production circuit coupled between the circuit node and a second power supply line to produce a plurality of voltages respectively at voltage nodes thereof, a multiplexer coupled to the voltage nodes of the voltage production circuit and an output node and configured to select and output one of the voltages to the output node, and a control circuit configured to supply the one of the voltages to the circuit node.

The control circuit may include an additional multiplexer coupled to the voltage nodes of the voltage production circuit and the circuit node and configured to select and supply the one of the voltages to the circuit node. The additional multiplexer could be configured to supply the one of the voltages to a selected one or ones of the voltage nodes that is or are different from a voltage node from which the one of the voltages is derived. In another embodiment, the control circuit may include an electrical path coupled between the output node and the circuit node.

According to another embodiment, a device is provided that includes a transistor coupled between a first power supply line and a circuit node, at least first and second voltage drop elements coupled in series between the circuit node and a second power supply line, a multiplexer coupled to the circuit node and a connection node between the first and second voltage drop elements and configured to select and couple one of the circuit node and the connection node to an output node, and a control circuit configured to increase a voltage difference between the first power supply line and the circuit node when the connection node is selected and coupled to the output node.

The control circuit may include a switch coupled between the connection node and the circuit node and configured to turn on when the multiplexer selects the connection node. The control circuit may further include an additional switch that includes both ends coupled in common to the circuit node and that is turned on when the multiplexer selects the connection node. In another embodiment, the control circuit may include an electrical path coupled between the output node and the circuit node.

According to another embodiment, a device is provided that includes a current source configured to produce a current at an output node thereof, a plurality of voltage drop elements coupled in series between the output node of the current source and a potential line to produce a plurality of voltages in response to the current supplied from the current source, and a voltage selection circuit configured to select one of the voltages to produce an output voltage and equalize a voltage at the output node of the current source substantially to the output voltage.

BRIEF DESCRIPTION OF THE DRAWINGS

FIG. 7 (a) illustrates an exemplary multiplexer MUX1.

FIG. 7 (b) illustrates an exemplary multiplexer MUX2.

DETAILED DESCRIPTION

The claimed subject matter will now be described herein with reference to illustrative embodiments. Those skilled in the art will recognize that many alternative embodiments can be accomplished using the teachings of this disclosure and that the claimed subject matter is not limited to the embodiments illustrated here for explanatory purposes.

Described are methods and circuits for voltage reference architectures that can increase the PSRR parameter. This can be achieved, for example, by improving the saturation margin for the output transistor. An exemplary architecture can employ an additional multiplexer so as to increase the voltage difference between the source terminal and the drain terminal of the output transistor, thus causing the transistor to operate in the saturation region. Various modifications and embodiments are possible as well, as described below and as would be readily apparent to one of ordinary skill in the art in view of the teachings of this application.

Figure 6:
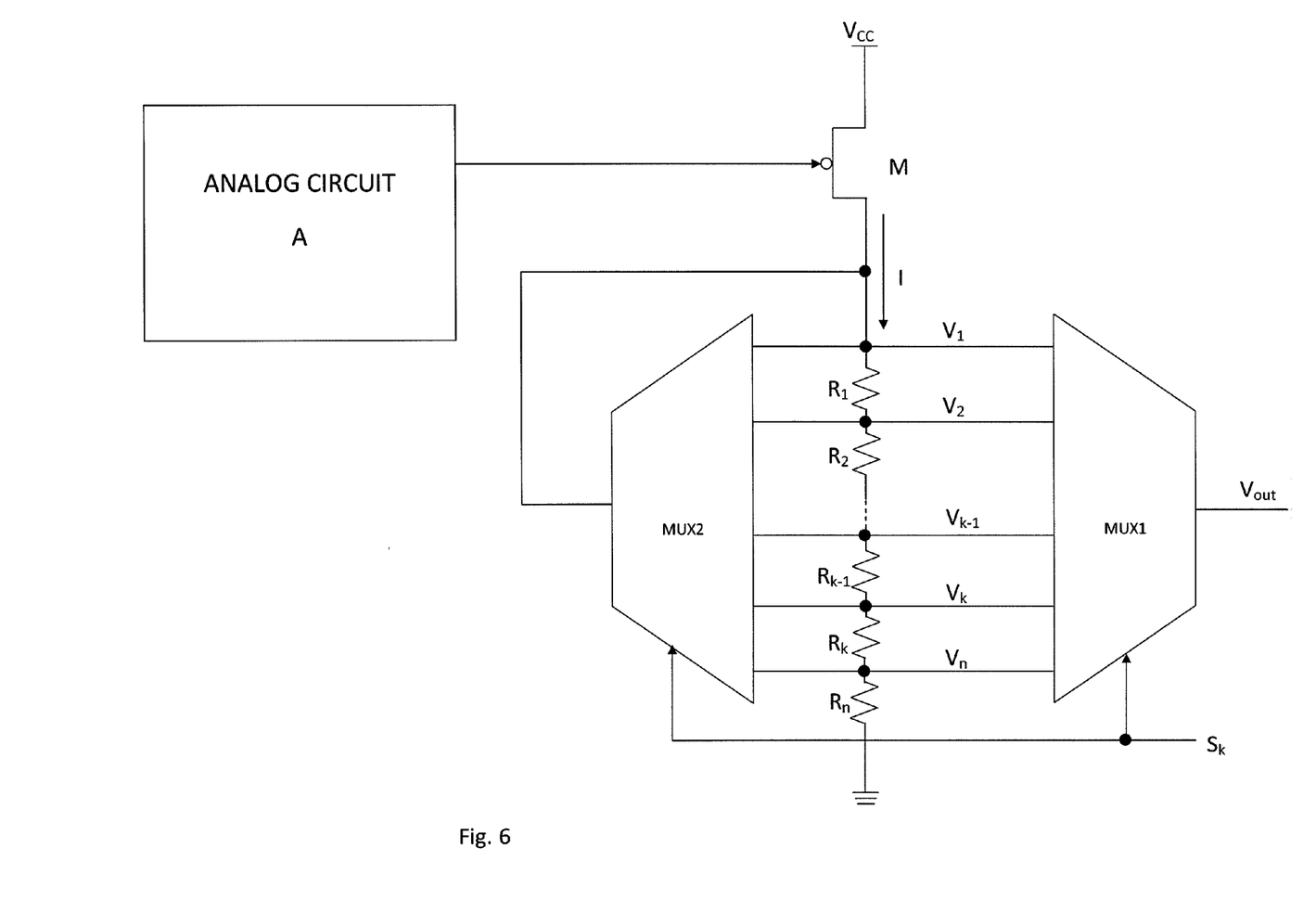
FIG. 6 illustrates an exemplary circuit architecture of a voltage reference with two multiplexers according to an embodiment.

FIG. 6 illustrates an exemplary circuit architecture of a voltage reference with two multiplexers according to an embodiment. The components in FIG. 6 which are the same to those in FIG. 5 are denoted by the same reference numerals or symbols to omit further descriptions thereof. Differently from FIG. 5, MUX2 is further provide in the circuit in FIG. 6. Circuit configurations of MUX1 and MUX2 will be explained below in FIGS. 7a and 7b. With reference to the claimed subject matter, FIG. 6 illustrates an exemplary device having first and second power supply lines $V_{cc}$ and Ground, respectively, a circuit node $V_1$, and output node $V_{out}$, a current source or transistor M, a voltage production circuit or at least first and second voltage drop elements $R_1$ through $R_n$, a multiplexer MUX1, and a control circuit MUX2.

Similar to the example of FIG. 5, when a voltage value is identified as being closest to a target value, MUX1 can be used to deliver the voltage to the output node $V_{out}$, however, differently from the example of FIG. 5, MUX2 can be used to bring an operation region of the transistor M into the saturation region when the target value is chosen. In an exemplary case described here, assume that $V_k$ is identified as being closest to the target value. $V_k$ can be set as $V_{out}$ by delivering selection signal $S_k$ over the selection bus S. Note that although a logic circuit L and decoder D are not illustrated, they can be included for controlling the selection signals as in FIG. 5.

Figure 7A:
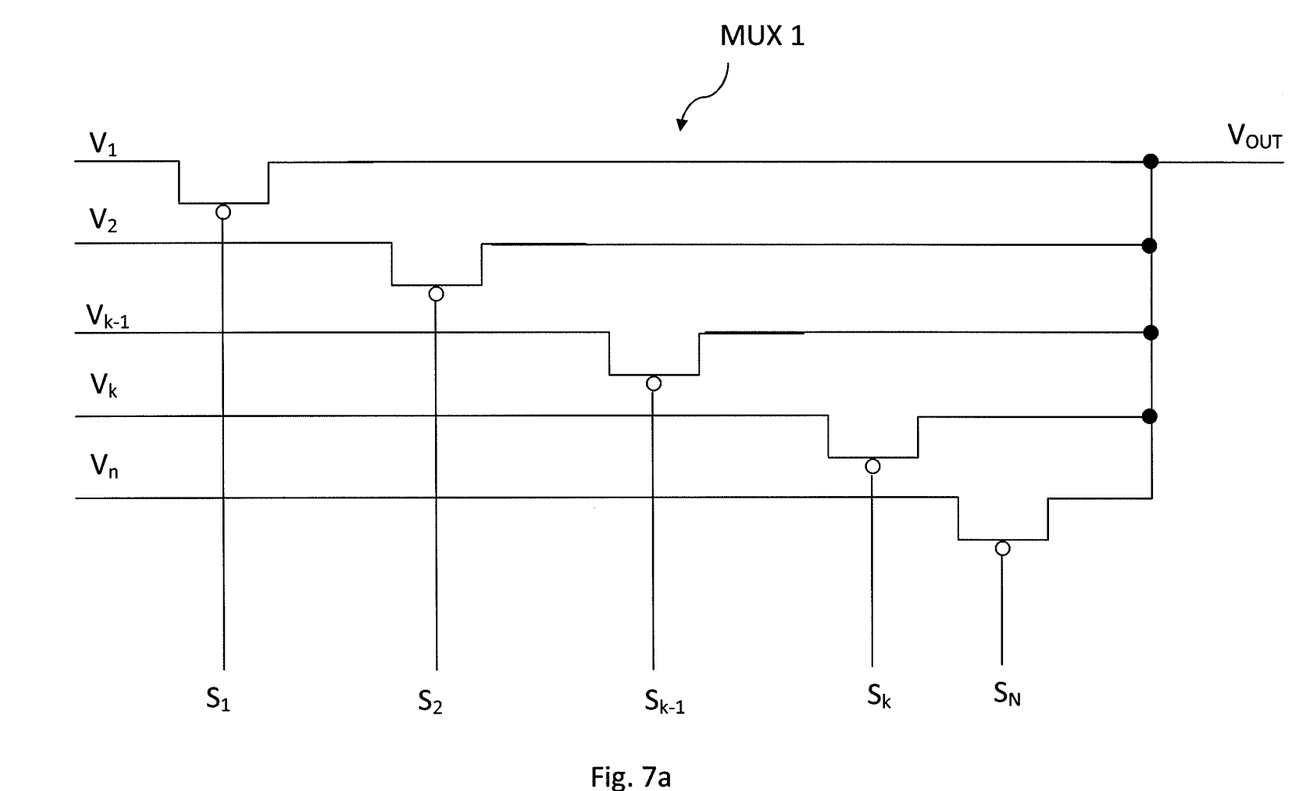
Figure 7B:
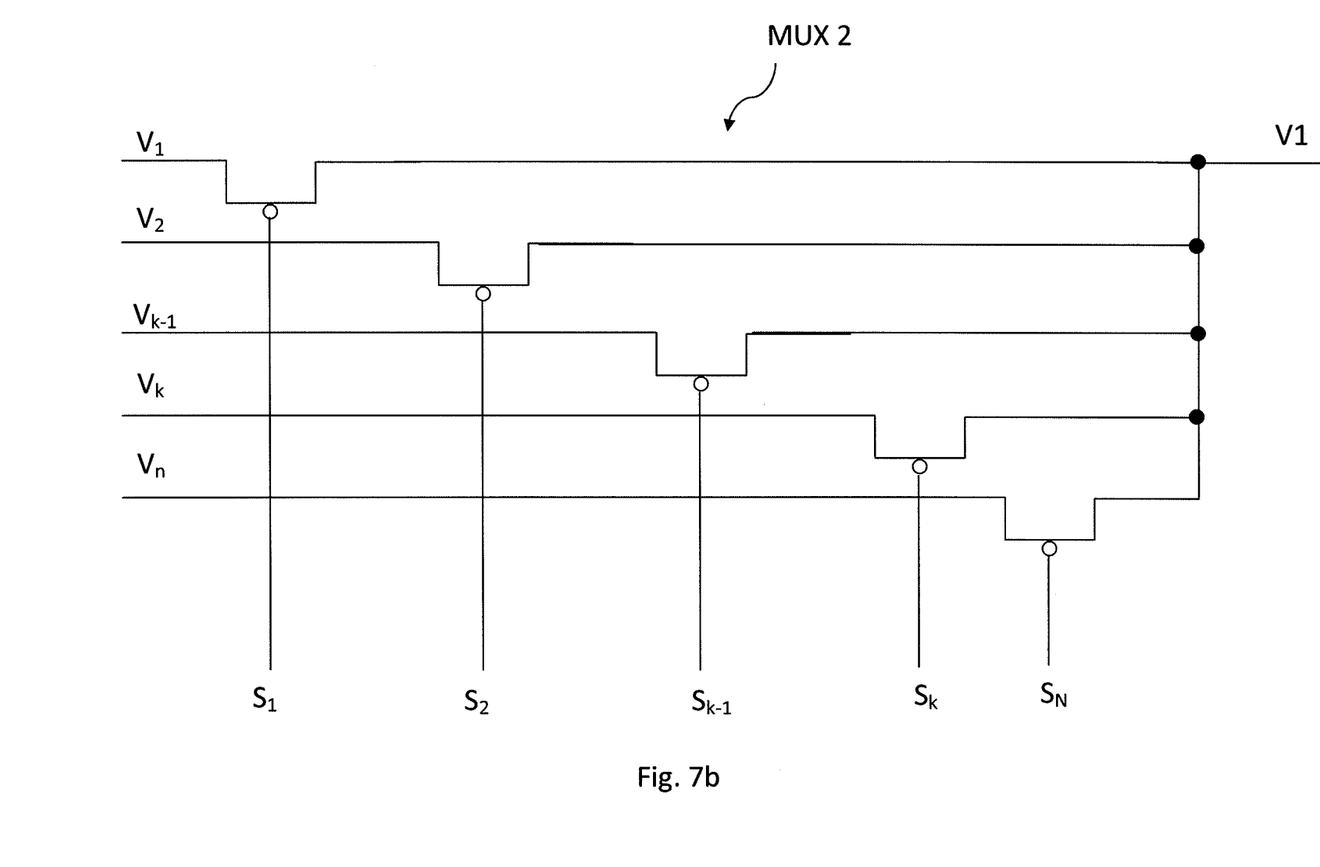

FIG. 7a illustrates an exemplary configuration of a multiplexer, such as MUX1. The multiplexer can have a separate PMOS transistor associated with each of nodes $V_1$ through $V_n$ (though NMOS transistors and CMOS pass gates can be used as well). The source and bulk terminals can be connected to the respective node $V_1$ through $V_n$ and the drain terminal can be connected to $V_{OUT}$. It is worth noting that in a more efficient structure the bulk terminals can be connected altogether to power supply Vcc. Selection signals $S_1$ through $S_N$ can be respectively delivered via bus S to the gates of these transistors to select the appropriate voltage value $V_1$ through $V_n$. The selected voltage can then be output as $V_{OUT}$. In this example, the selection signal should be forced low in order to select a particular voltage. Thus, in this case, since $V_k$ is closest to a target value, the selection signal $S_k$ can be set to zero. The selection signal $S_k$ can then be delivered to the gate of the transistor associated with node $V_k$, thus turning on the transistor and allowing $V_k$ to be output as $V_{OUT}$. FIG. 7b illustrate an exemplarily configuration of a multiplexer, such as MUX2. MUX2 can have the same or substantially same configuration to MUX1, except that its output of MUX2 can be fed back to node $V_1$, as illustrated in FIG. 6. With reference to the claimed subject matter, one of the transistors as described above and as implemented in MUX2 can be an example of the claimed switch.

In this example, when any selection signals are not asserted, the voltage at the V1 node (i.e., voltage at the drain terminal of the transistor M) is represented by the voltage value $V_k+V_{drop}$, where $V_k$ is described above and $V_{drop}=(R_1+R_2+\ldots+R_{k-1})*I$. However, when the selection signal $S_k$ is asserted, a transistor corresponding to the selection signal $S_k$ is rendered on-state, and the $V_k$ node is connected via the on-state transistor to the node $V_1$. The on-state transistor has a negligible small resistance value, compared to resistance value $(R_1+R_2+\ldots+R_{k-1})$ of the resistors coupled in serial between the $V_1$ and $V_k$ nodes, (compared to R1, in case that K=2, of one resistor). This leads to produce current flow from the $V_1$ node (e.g. the drain node of the transistor M) via the on-state transistor to the Vk node and to change the resistance between the $V_1$ and $V_k$ nodes from $(R_1+R_2+\ldots+R_{k-1})$ to be a negligible small resistance value which is a value $R_{on}$ of the MUX2. Where $V_k$ is selected, as in this example, $R_{on}$ represents the resistance of the selection transistor between the $V_k$ node and the drain terminal of the M transistor. In this way, when $S_k$ is asserted, the voltage difference between the $V_1$ and $V_k$ nodes is led to be the same or substantially same to zero, and thus the voltage difference between the source and drain terminal of the transistor M is enhanced (or is increased). Therefore, the operation region of the transistor M is brought into the saturation region.

Assume that the number of resistors $R_1$ through $R_n$ is four—$R_1$, $R_2$, $R_3$, and $R_4$—and the number of selection signals is also four—$S_1$, $S_2$, $S_3$, and $S_4$. In this case, the number of transistors in each of MUX1 and MUX2 would also be four—$a_1$, $a_2$, $a_3$, and $a_4$ in MUX1 and $b_1$, $b_2$, $b_3$, and $b_4$ in MUX2. To select $V_1$ as the output voltage $V_{out}$, the transistor $a_1$ in MUX1 can be turned on by asserting selection signal $S_1$. At the same time, asserting selection signal $S_1$ causes transistor $b_1$ in MUX2 to be turned on. Since selection signals $S_2$ through $S_4$ remain unasserted, transistors $a_2$ through $a_4$ and $b_2$ through $b_4$ remain turned off. Any of $V_2$ through $V_4$ can be selected in a similar fashion by asserting selection signals $S_2$ through $S_4$, respectively. In addition, the current value of the constant current I produced by the M transistor and the resistance value of each of resistors $R_1$ through $R_4$ are configured such that the voltages $V_1$, $V_2$, $V_3$, and $V_4$ assume voltage values 1.3V, 1.25V, 1.2V, and 1.15V, respectively.

Figure 8:
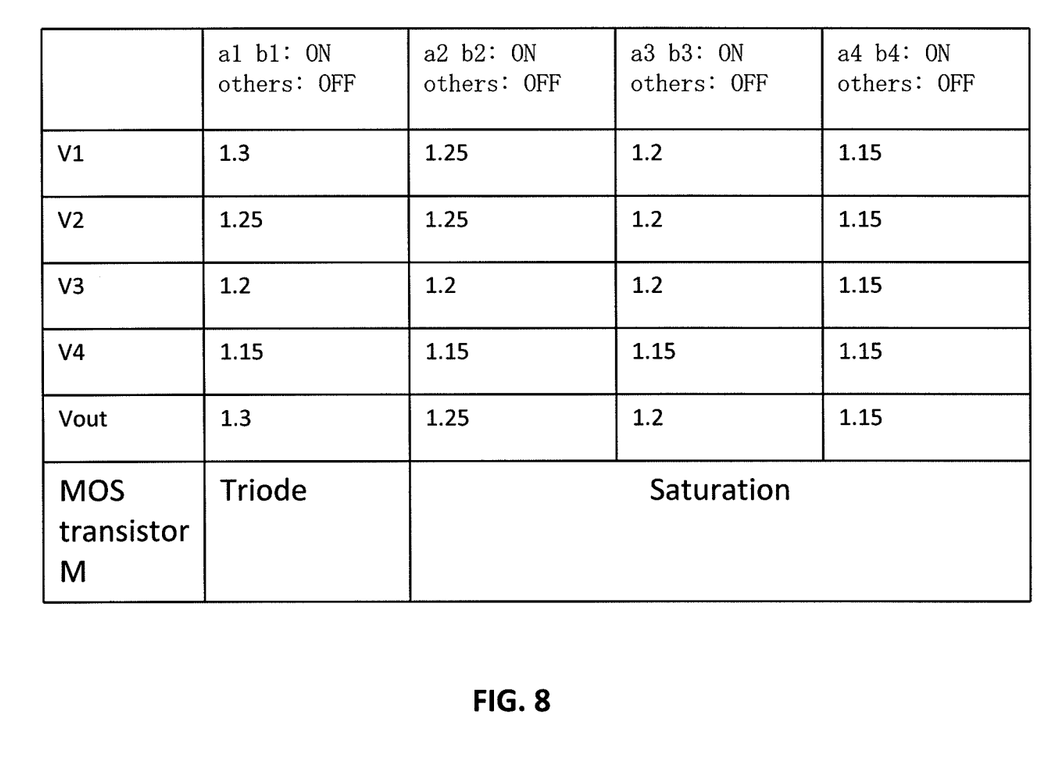
FIG. 8 depicts a chart of exemplary voltage levels and transistor states according to an example.

FIG. 8 depicts a table showing the actual voltage levels of the nodes $V_1$ through $V_4$ and $V_{out}$ as well as the state of the M transistor as a result of the state of transistors $a_1$ through $a_4$ of MUX1 and $b_1$ through $b_4$ of MUX2, according to this example. When $a_1$ and $b_1$ are turned on, $V_{out}$ assumes the value of $V_1$ (1.3V) and the other voltage nodes maintain their usual value. However, when $a_2$ and $b_2$ are turned on (and the other transistors are kept off), not only does $V_{out}$ assume the value of $V_2$ (1.25V), but $V_1$ also assumes the value of $V_2$ due to $V_2$ being connected to the $V_1$ node by MUX2's output line. Similarly, $V_1$, $V_2$, and $V_{out}$ all assume the value of $V_3$ (1.2V) when $a_3$ and $b_3$ are turned on, and all of the nodes assume the value of $V_4$ (1.15V) when $a_4$ and $b_4$ are turned on. Accordingly, it can be ensured that the M transistor operates in a saturation region upon selecting one of the voltages $V_2$, $V_3$, or $V_4$. This can suppress changes in the level of $V_{out}$ caused by variations of the power supply voltage $V_{cc}$. As a result, the PSRR of the circuit can be raised.

Figure 9:
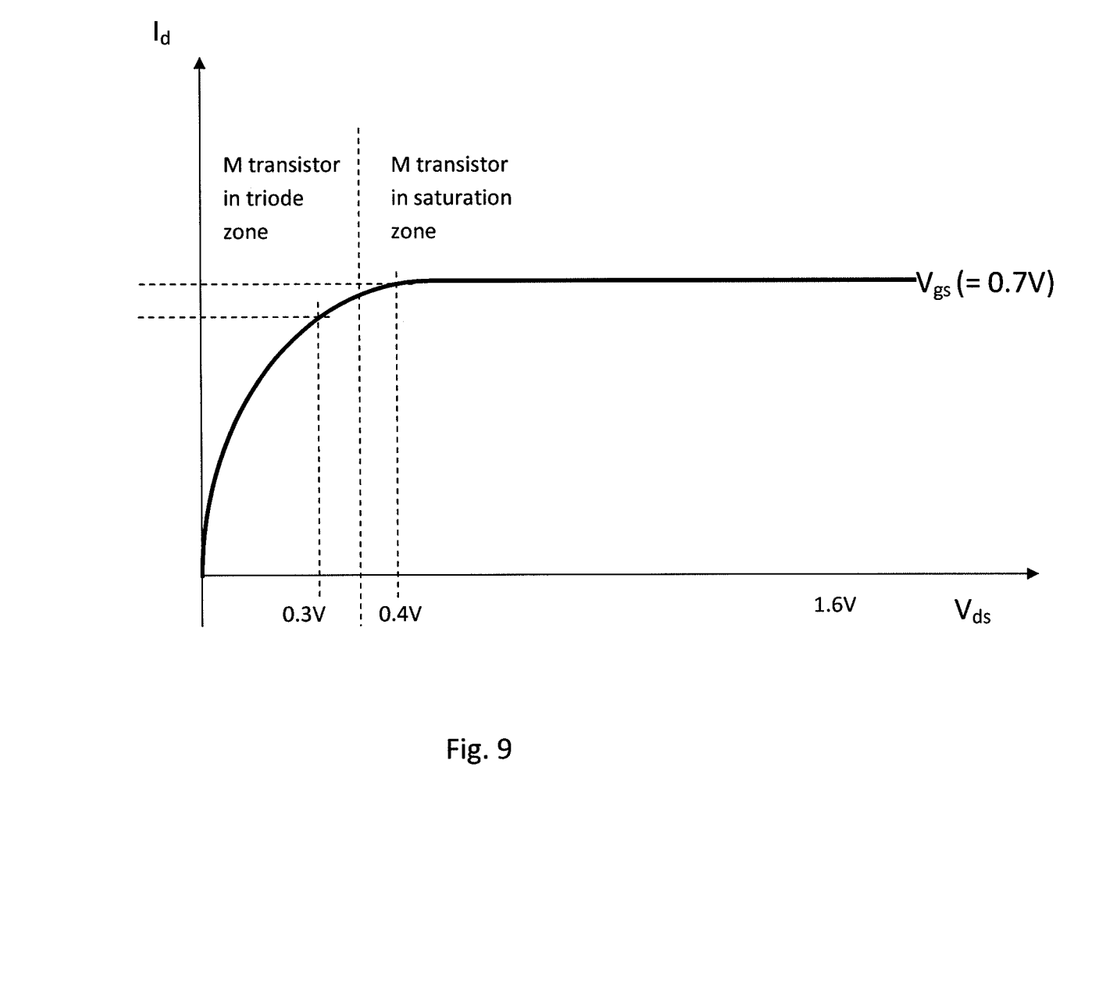
FIG. 9 depicts a characteristic curve of voltage and current values for a transistor according to an example.

FIG. 9 depicts a characteristic curve of voltage and current values for the M transistor according to this example. Referring to FIG. 6, assuming that the power supply voltage $V_{cc}$ is 1.6V, when the transistor M is biased with the gate-source bias voltage $V_{gs}$ from the analog circuit A to produce a constant current I, the voltage between the source and drain of the M transistor becomes 0.3V since $V_{cc}-V_1=1.6V-1.3V=0.3V$. As a result, if MUX2 were not provided such as in FIG. 5, the M transistor would continue to operate in a triode region regardless of which voltage of $V_1$ through $V_4$ was selected by MUX1 since $V_1$ would remain at 1.3V. As a result, the output voltage $V_{out}$ would be subjected to change in level in accordance with the variation of the power supply voltage $V_{cc}$ regardless of which voltage was selected.

However, if MUX2 is provided as shown in FIG. 6, when either one of the voltages $V_2$, $V_3$ and $V_4$ is selected as the output voltage $V_{out}$, the voltage $V_{ds}$ between the source and drain of the transistor M is increased to bring the operation region of the transistor M into the saturation region. For example, as depicted in FIG. 9, the M transistor enters the saturation region from the triode region when the voltage $V_{ds}$ between the drain and source of the transistor is approximately 0.35V. Referring to FIG. 8, when $V_2$ is selected, $V_1$ assumes the value of 1.25V, which results in $V_{ds}$ assuming the value 0.35V since $V_{cc}-V_1=1.6V-1.25V=0.35V$. Similarly, if $V_3$ were selected then $V_{ds}$ would equal 0.4V and if $V_4$ were selected then $V_{ds}$ would equal 0.45V, thus permitting the M transistor to continue to operate in the saturation region. This can stabilize the current flowing through the M transistor so as to maintain an approximately constant current as well as stabilize the voltage $V_2$, $V_3$, or $V_4$ as the output voltage $V_{out}$ against changes in the power supply voltage $V_{cc}$.

Figure 10:
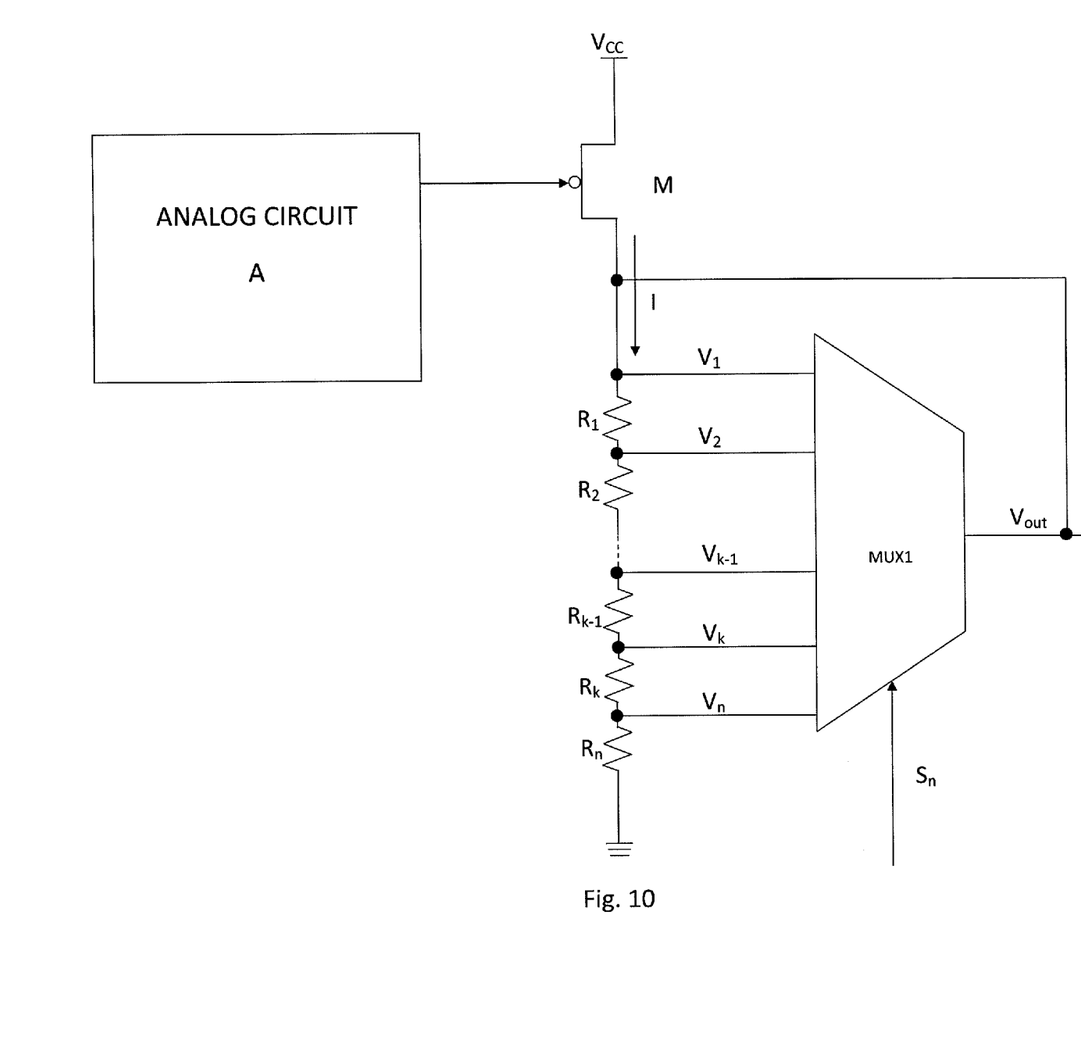
FIG. 10 illustrates an exemplary circuit architecture of a voltage reference with one multiplexer according to an embodiment.

FIG. 10 illustrates an exemplary circuit architecture of a voltage reference according to an embodiment in which MUX2 is eliminated. In this case, the $V_1$ node and the $V_{out}$ node can be directly connected. Similar to the previous embodiment, this can increase the value of $V_{ds}$ when one of $V_2$ through $V_n$ is selected as $V_{out}$, thus achieving similar effects and benefits as described above. With reference to the claimed subject matter, the connection between the $V_1$ node and the $V_{out}$ node can be an example of the claimed electrical path coupled between the output node and the circuit node.

In another embodiment, the MUX2 can be configured such that for all the selection signals $S_1$ through $S_k$, a connection between the $V_1$ node and the $V_1$ through $V_k$ nodes is realized. This can further reduce the value of $R_{on}$ of MUX2, $R_{on}$ being the resistance of the selection transistor between the selected voltage node and the drain terminal of the M transistor. Accordingly, when $V_k$ is selected, all of the transistors in MUX2 which short circuit the resistors above $V_k$ are turned on, which reduces the resistance of the connection. The equivalent resistances in this case depending on which of $V_1$ through $V_n$ is selected can be expressed according to the following series:

$$R_{ONm}//R_{ONm}+R//R_{ONm}+2R//\ldots//R_{ONm}+(K-2)R,$$

where $R_{ONm}$ is the resistance of one PMOS transistor in MUX2 in the on state and R, 2R, ..., (K−2)R are the resistance values of the resistors in the resistive partition depending on which of $V_1$ (the first in the series) through $V_n$ (the last in the series) is selected. Note that this example assumes that the resistance value of each resistor in the resistive partition is the same.

Note that this embodiment can be particularly effective if the $R_{ONm}$ of the PMOS transistor is comparable with the resistance of the R module used in the resistive partition. Such may be the case, for example, when the output voltage $V_{out}$ must be trimmed with high accuracy, thus requiring a very small step and a low voltage drop across each resistor.

Figure 11:
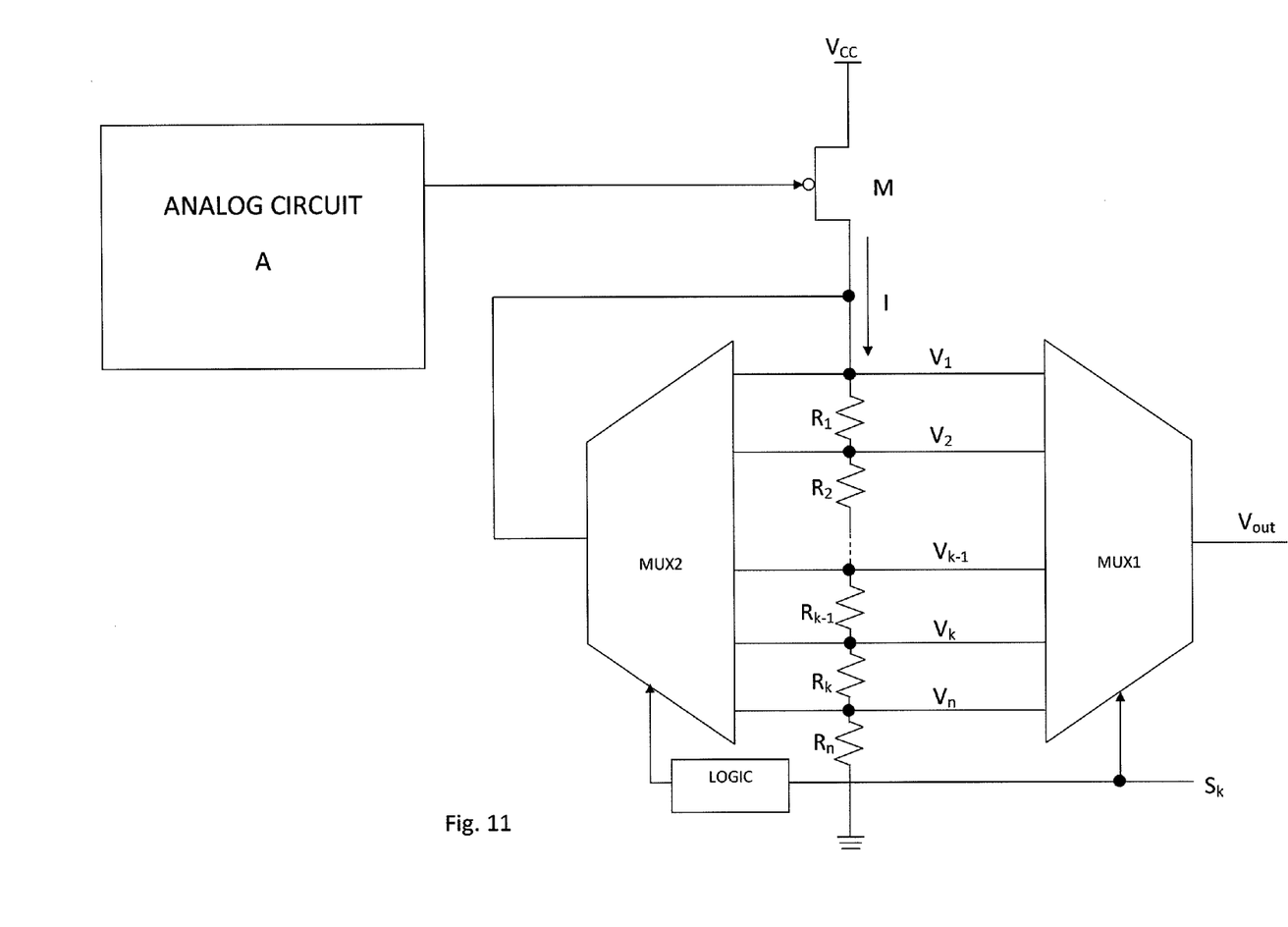
FIG. 11 illustrates an exemplary circuit architecture of a voltage reference with two multiplexers and a logic block driving one of the multiplexers according to an embodiment.

FIG. 11 illustrates an exemplary circuit architecture of a voltage reference according to this embodiment. A logic circuit can be associated with MUX2, interposed between selection bus S and MUX2. The logic circuit can facilitate the functionality described above.

Figure 12:
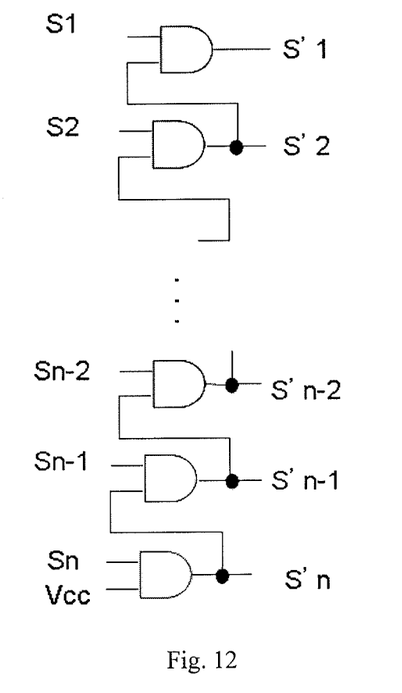
FIG. 12 illustrates an example of the logic block depicted in FIG. 11.

FIG. 12 illustrates an example of such the logic circuit. The logic circuit receives a set of select signals $S_1, \ldots S_n$ and a power-supply signal Vcc, and outputs a set of select signals $S'_1, \ldots, S'_n$. Based on the signals $S'_1, \ldots, S'_n$, transistors of MUX2 are respectively rendered conductive or non-conductive. The logic circuit can include a positive integer "n" of AND logic gates. The final stage of AND logic gate receives the Vcc and $S_n$ signals, and outputs the $S'_n$ signal. The following stage of AND logic gate receive the $S'_n$ and $S_{n-1}$ signals, and outputs the $S'_{n-1}$ signal. The further following AND logic gates are configured as same. In the operation thereof, when $S_k$ is asserted, the signals $S'_1$ to $S'_K$ are low (i.e. logic value "0") to render the transistors associated with $V_1$ to $V_k$ turn on-state (conductive), on the other hand the signals $S'_{K+1}$ to $S'_n$ are high (i.e. logic value "1") to render the remaining transistors associated with $V_{k+1}$ to $V_n$ keep off-state (non-conductive).

Figure 13:
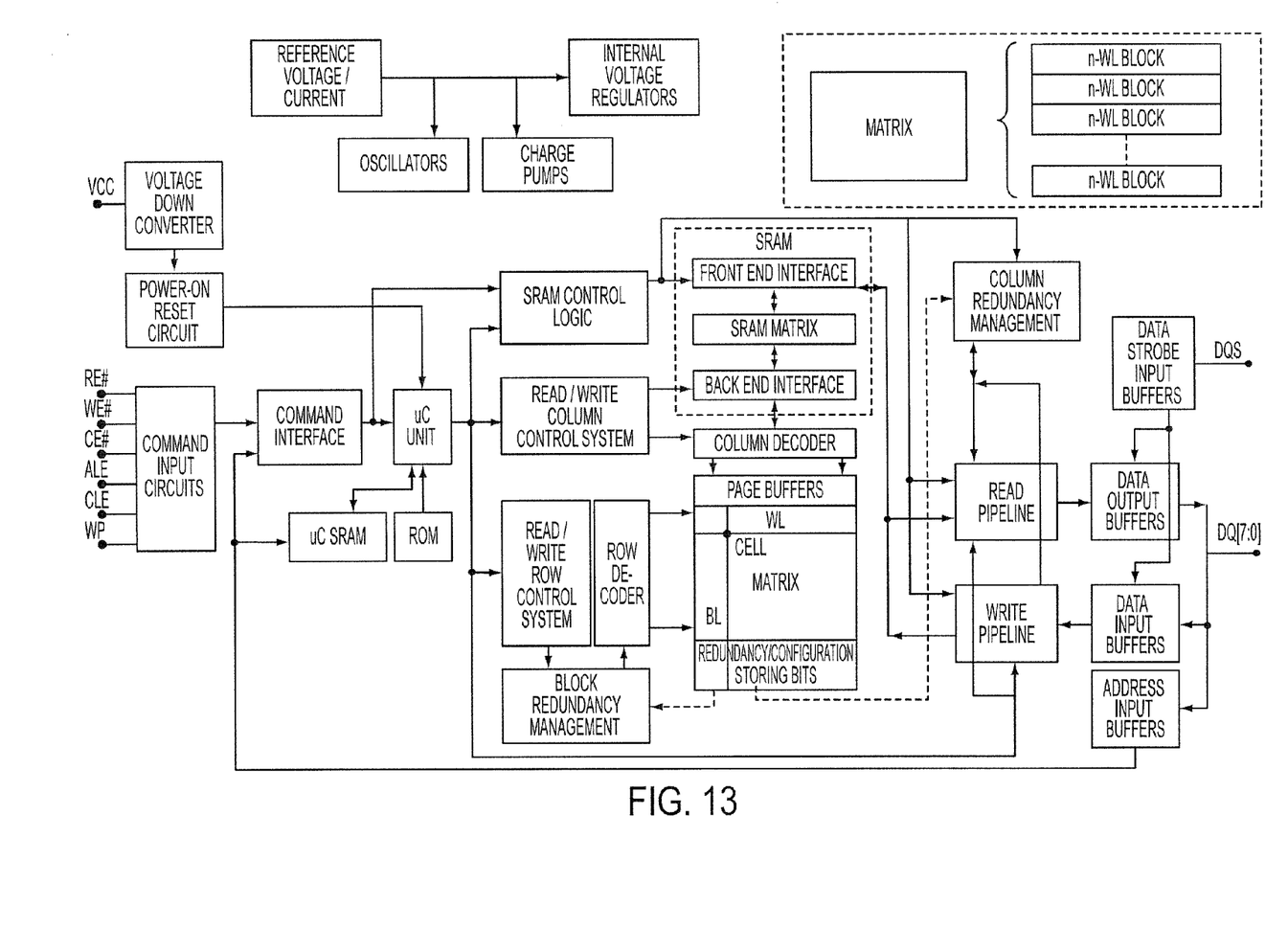
FIG. 13 illustrates various components of an exemplary NAND flash memory.

FIG. 13 illustrates various components of an exemplary NAND flash memory. One of ordinary skill in the art can understand how the various components function and are interrelated. One of ordinary skill in the art can understand how to implement the disclosed techniques and circuits in a flash memory such as is disclosed in this figure. In particular, implementation of the disclosed techniques and circuits can involve the reference voltage/current block at the top left of the figure.

One skilled in the relevant art will recognize that many possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to utilize the disclosure and various embodiments with various modifications as suited to the particular use contemplated.

Furthermore, while this specification contains many specifics, these should not be construed as limitations on the scope of what is being claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A device comprising:
   first and second power supply lines;
   a circuit node;
   an output node;
   a current source coupled between the first power supply line and the circuit node;
   a voltage production circuit, coupled between the circuit node and the second power supply line, configured to produce a plurality of voltages respectively at voltage nodes thereof;
   a multiplexer, coupled to the voltage nodes of the voltage production circuit and the output node, configured to select and output one of the voltages to the output node; and
   a control circuit configured to supply the one of the voltages to the circuit node.

2. The device of claim 1, wherein the control circuit comprises an additional multiplexer, coupled to the voltage nodes of the voltage production circuit and the circuit node, configured to select and supply the one of the voltages to the circuit node.

3. The device of claim 2, wherein the additional multiplexer is configured to supply the one of the voltages to a selected one or ones of the voltage nodes that is or are different from a voltage node from which the one of the voltages is derived.

4. The device of claim 3, further comprising:
   a logic circuit configured to supply a plurality of control signals to the additional multiplexer, and wherein the additional multiplexer selects the selected one or ones of the voltage nodes in response to the control signals supplied from the logic circuit.

5. The device of claim 4, wherein the additional multiplexer includes:
a plurality of switches each coupled between an associated one of the voltage nodes of the voltage production circuit and the circuit node, and each configured to turn on or off in response to an associated one of the control signals supplied from the logic circuit.

6. The device of claim 5, wherein each of the switches is one of a PMOS transistor, a NMOS transistor, and a CMOS pass gate.

7. The device of claim 1, wherein the control circuit comprises an electrical path coupled between the output node and the circuit node.

8. The device of claim 1, wherein the current source comprises a transistor coupled between the first power supply line and the circuit node.

9. The device of claim 1, wherein the voltage production circuit comprises a plurality of resistors coupled in series between the circuit node and the second power supply.

10. A device comprising:
first and second power supply lines;
a circuit node;
an output node;
a transistor coupled between the first power supply line and the circuit node;
at least first and second voltage drop elements coupled in series between the circuit node and the second power supply line;
a multiplexer, coupled to the circuit node and a connection node between the first and second voltage drop elements, configured to select and couple one of the circuit node and the connection node to the output node; and
a control circuit configured to increase a voltage difference between the first power supply line and the circuit node when the connection node is selected and coupled to the output node.

11. The device of claim 10, wherein the control circuit comprises a switch coupled between the connection node and the circuit node and configured to turn on when the multiplexer selects the connection node.

12. The device of claim 11, wherein the control circuit further comprises an additional switch that includes both ends coupled in common to the circuit node and configured to turn on when the multiplexer selects the connection node.

13. The device of claim 12, further comprising a logic circuit configured to supply a first control signal to turn the switch on and the logic circuit configured to supply a second control signal to turn the additional switch on.

14. The device of claim 12, wherein the switch comprise a first transistor, wherein the additional switch comprises a second transistor, and the logic circuit includes:
a first AND logic gate including a first input node receiving a power-supply signal, a second input node receiving a first select signal, and an output node coupled to a control gate of the first transistor, and
a second AND logic gate including a first input node coupled to the output node of the first AND logic gate, a second input node receiving a second select signal, and an output node coupled to a control gate of the second transistor.

15. The device of claim 12, wherein each of the switch and the additional switch is one of a PMOS transistor, a NMOS transistor, and a CMOS pass gate.

16. The device of claim 10, wherein the control circuit comprises an electrical path coupled between the output node and the circuit node.

17. A device comprising:
a current source configured to produce a current at an output node thereof;
a plurality of voltage drop elements coupled in series between the output node of the current source and a potential line to produce a plurality of voltages in response to the current supplied from the current source; and
a voltage selection circuit configured to select one of the voltages to produce an output voltage and equalize a voltage at the output node of the current source substantially to the output voltage.

18. The device of claim 17, wherein the voltage selection circuit includes:
a first multiplexer circuit including first input nodes each receiving one of the voltages and an output node coupled to the output node of the current source.

19. The device of claim 17, wherein the voltage selection circuit includes:
a first multiplexer circuit including first input nodes each receiving a corresponding one of the voltages and an output node which is not coupled to the output node of the current source, and
a second multiplexer circuit including second input nodes each receiving the corresponding one of the voltages and an output node which is coupled to the output node of the current source.

20. The device of claim 17, wherein each of the voltage drop elements is a resistor.

* * * * *